United States Patent
Doyle et al.

(10) Patent No.: US 7,217,644 B2
(45) Date of Patent: May 15, 2007

(54) METHOD OF MANUFACTURING MOS DEVICES WITH REDUCED FRINGING CAPACITANCE

(75) Inventors: Brian Doyle, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 10/897,291

(22) Filed: Jul. 21, 2004

(65) Prior Publication Data

US 2004/0256673 A1 Dec. 23, 2004

Related U.S. Application Data

(62) Division of application No. 10/256,978, filed on Sep. 27, 2002, now Pat. No. 6,784,491.

(51) Int. Cl.
*H01L 21/3205* (2006.01)

(52) U.S. Cl. .................... 438/592; 438/183; 438/926; 257/E21.453

(58) Field of Classification Search ................. 438/211, 438/230, 592, 183, 926; 257/E21.453
See application file for complete search history.

(56) References Cited

U.S. PATENT DOCUMENTS

| | | | | |
|---|---|---|---|---|
| 4,272,880 A * | 6/1981 | Pashley | ...................... | 438/153 |
| 6,025,235 A * | 2/2000 | Krivokapic | ................. | 438/289 |
| 6,034,401 A * | 3/2000 | Hsia et al. | ................... | 257/369 |
| 6,169,315 B1 * | 1/2001 | Son | ............................ | 257/408 |
| 6,316,323 B1 * | 11/2001 | Fang et al. | ................. | 438/305 |
| 6,326,272 B1 * | 12/2001 | Chan et al. | ................. | 438/300 |
| 6,392,271 B1 * | 5/2002 | Alavi et al. | ................. | 257/328 |
| 6,624,032 B2 * | 9/2003 | Alavi et al. | ................. | 438/283 |
| 2002/0192911 A1 * | 12/2002 | Parke | ......................... | 438/270 |

* cited by examiner

*Primary Examiner*—Michael Lebentritt
*Assistant Examiner*—Stanetta Isaac
(74) *Attorney, Agent, or Firm*—Blakely, Sokoloff, Taylor & Zafman LLP

(57) ABSTRACT

An embodiment of the present invention includes a gate dielectric layer, a polysilicon layer, and a gate electrode. The gate dielectric layer is on a substrate. The substrate has a gate area, a source area, and a drain area. The polysilicon layer is on the gate dielectric layer at the gate area. The gate electrode is on the polysilicon layer and has arc-shaped sidewalls.

4 Claims, 4 Drawing Sheets

METHOD OF MANUFACTURING MOS DEVICES WITH REDUCED FRINGING CAPACITANCE

CROSS-REFERENCES TO RELATED APPLICATIONS

This is a Divisional Application of U.S. patent application Ser. No. 10/256,978, filed Sep. 27, 2002 now U.S. Pat. No 6,784,491. This Divisional Application claims the benefit of the U.S. patent application Ser. No. 10/256,978.

BACKGROUND

1. Field of the Invention

Embodiments of the invention relates to the field of semiconductor, and more specifically, to semiconductor fabrication.

2. Description of Related Art

The total capacitance of Metal Oxide Semiconductor (MOS) devices includes a number of different types of capacitance. The two types of capacitance that have significant effect on the switching time of MOS devices are the gate capacitance and the fringing capacitance. As gate lengths reduce, these capacitances also reduce. However, when the gate length reaches 0.05 micron and beyond, the capacitances do not reduce equally. Since the polysilicon lines become thinner as the gate length decreases, the gate capacitance decreases. but the fringing capacitance does not decrease as rapidly. Typically, at the 30 nm gate length dimensions, the fringing capacitance can add up to one-third of the total capacitance.

One way to reduce the fringing capacitance is to reduce the height of the polysilicon layer. However, reducing the polysilicon height only slightly reduces the fringing capacitance because it merely removes the longest field lines having the smallest capacitance. The majority of the shorter field lines with large capacitance still remains. Reducing the polysilicon height also adds complexity to the fabrication process.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a gate dielectric layer, a polysilicon layer, and a gate electrode. The gate dielectric layer is on a substrate. The substrate has a gate area, a source area, and a drain area. The polysilicon layer is on the gate dielectric layer at the gate area. The gate electrode is on the polysilicon layer and has arc-shaped sidewalls.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

Figure 1:
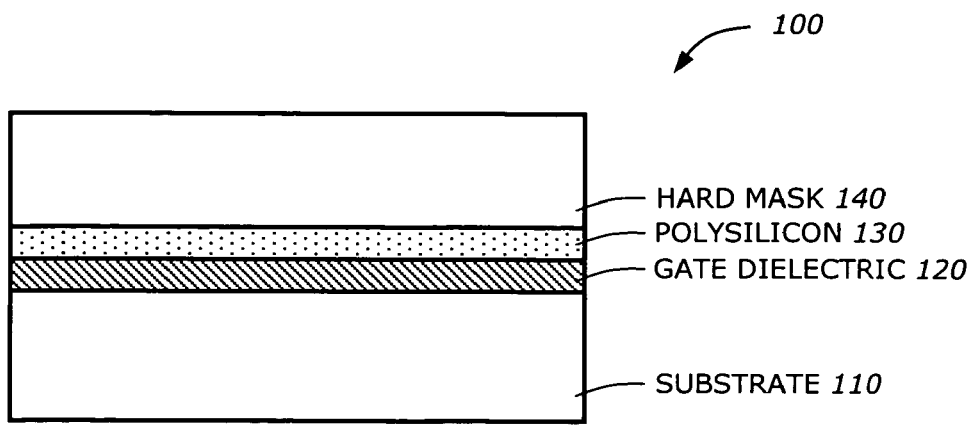
FIG. 1 is a diagram illustrating formation of a structure according to one embodiment of the invention.

FIG. 1 is a diagram illustrating formation of a structure 100 according to one embodiment of the invention. The structure 100 includes a substrate 110, a gate dielectric layer 120, a polysilicon layer 130, and a hardmask 140.

The substrate 110 is typically obtained from a silicon wafer using traditional metal oxide semiconductor (MOS) fabrication process. For example, the substrate 10 may be a lightly p-doped wafer or a heavily p-doped wafer from which a lightly p-doped epi layer is grown. The exact doping is chosen to provide desirable device characteristics such as low source and drain-to-substrate capacitance, high source and drain-to-substrate breakdown voltage, high carrier mobility, etc. The substrate 110 has a gate area in the middle and the source and drain areas on two sides of the gate area.

The gate dielectric layer 120 is deposited on the substrate 110. The gate dielectric layer 120 may be a nitride, oxide, or high-k layer having a thickness suitable for the corresponding device technology. The gate dielectric layer 120 and the substrate 110 forms a base structure upon which a gate stack is formed.

The polysilicon layer 130 is deposited on the gate dielectric layer 110. The polysilicon layer 130 is typically a thin layer of doped polysilicon. The doping concentration depends on the desirable resistance. The hardmask 140 is deposited on the polysilicon layer 130. The hardmask 140 may be of any material that can be selectively etchable to the polysilicon layer 130. Examples of the hardmask 140 include nitride, oxide, and silicon germanium (SiGe).

Figure 2:
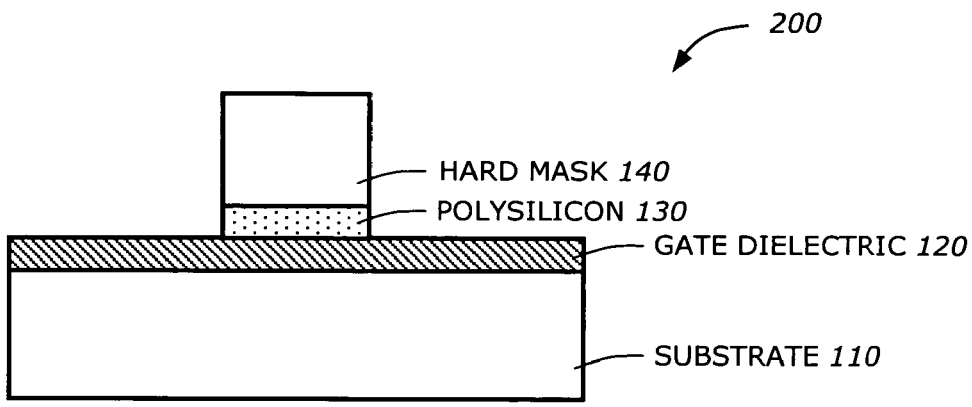
FIG. 2 is a diagram illustrating formation of a gate stack according to one embodiment of the invention.

FIG. 2 is a diagram illustrating formation of a gate stack according to one embodiment of the invention. The gate stack is formed by etching the hardmask 140 and the polysilicon layer 130. The etching can be performed by conventional etching techniques such as chemical etching to selectively etch the hardmask 140 and the polysilicon layer 130 at the source and drain areas so that the gate stack is formed at the gate area.

Figure 3:
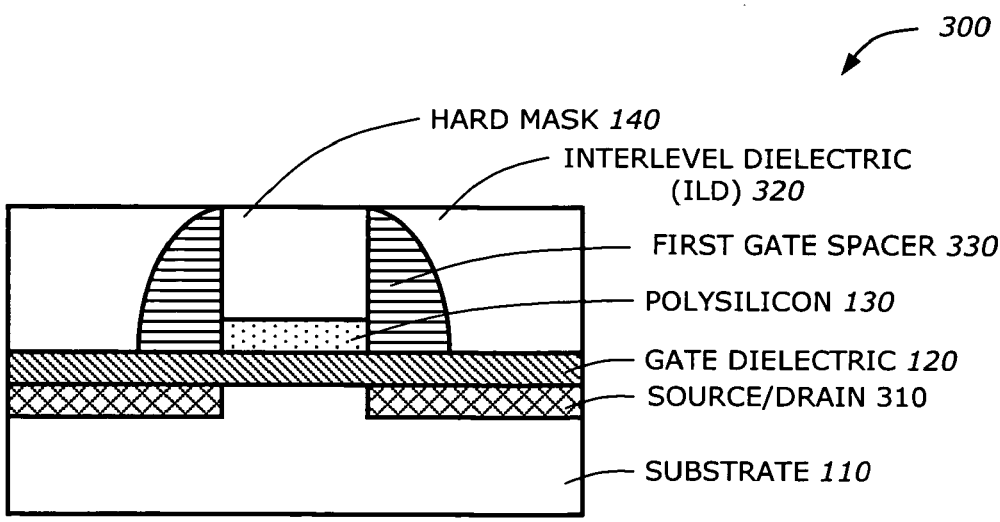
FIG. 3 is a diagram illustrating formation of an interlevel dielectric (ILD) layer according to one embodiment of the invention.

FIG. 3 is a diagram illustrating formation of an interlevel dielectric (ILD) layer according to one embodiment of the invention. The process is carried out with conventional process. For example, a spacer dielectric layer is deposited on the gate stack and the gate dielectric layer 120. The spacer dielectric material may be an oxide (e.g., $SiO_2$) or a nitride. The deposition of the spacer dielectric material may be done by plasma-enhanced chemical vapor deposition (CVP) or low pressure CVP (LPCVP). A silicide is formed in the source and drain areas to become source/drain silicide 310. The silicide may be Titanium or Cobalt and may be used as a self-aligned silicide (salicide). The source/drain silicide 310 helps reducing path resistance between the metal contact and the channel edge. Gate spacers 330 are formed on two sides of the gate stack. The gate spacers are usually a nitride, an oxide, or an oxide/nitride stack. An ILD layer 320 is deposited on the gate dielectric layer 120 and the gate spacers 330. The ILD layer 320 may use material suitable for electrically isolating one level of conductor from another. The ILD layer 320 may also have a high contamination level because it is in the back end of the process. Examples of the material for the ILD layer 320 are $SiO_2$, silicon nitride, and low-k dielectrics.

Figure 4:
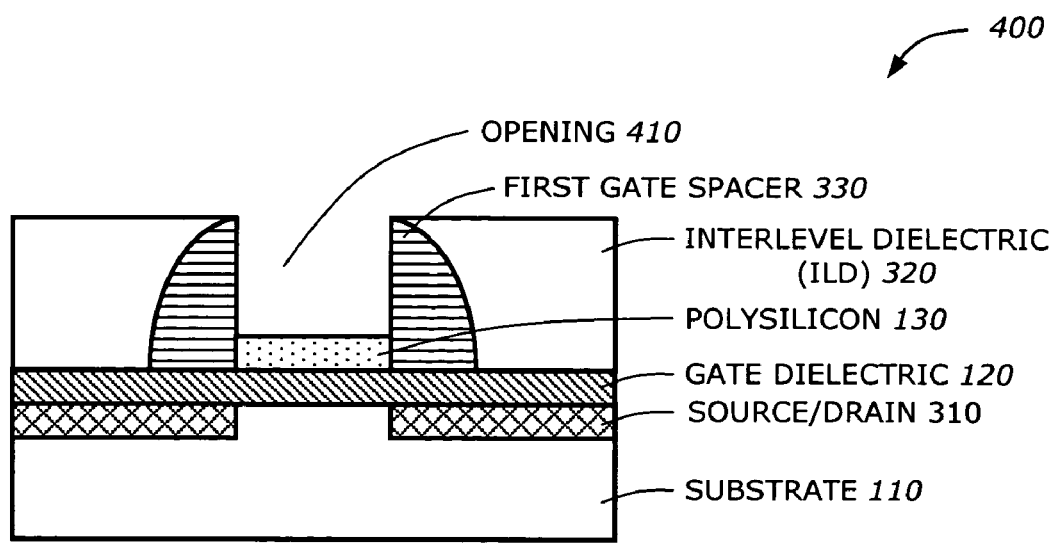
FIG. 4 is a diagram illustrating formation of an gate opening according to one embodiment of the invention.

FIG. 4 is a diagram illustrating formation of a gate opening 140 according to one embodiment of the invention. The hardmask 140 is selectively etched away within the area bounded by the ILD spacers 330 and the polysilicon layer 130. The hardmask 140 is etched to the endpoint of the doped polisilicon layer 130. When the hardmask 140 is completely etched away, a gate opening 140 is formed.

Figure 5:
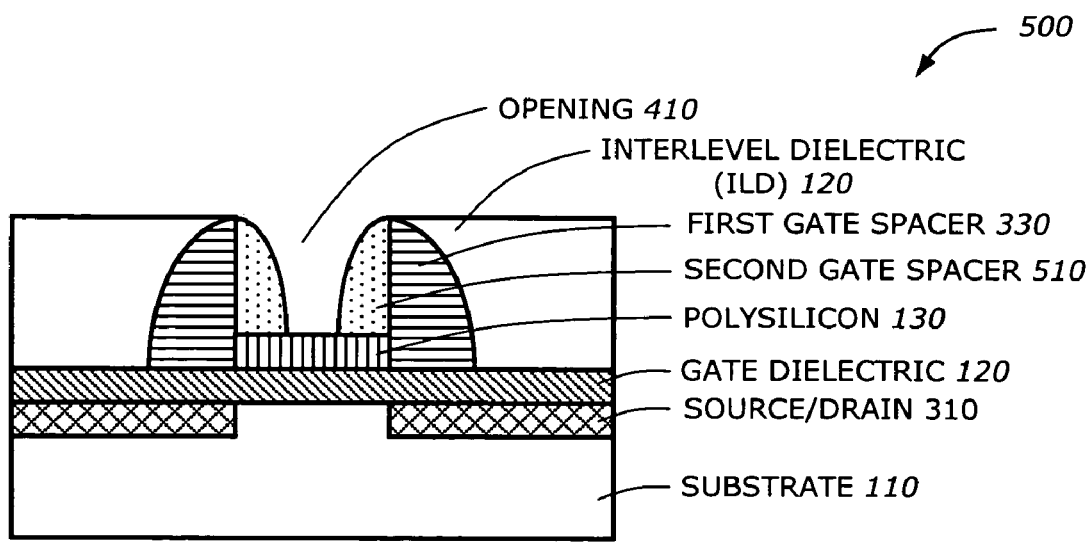
FIG. 5 is a diagram illustrating formation of gate spacers according to one embodiment of the invention.

FIG. 5 is a diagram illustrating formation of gate spacers 510 according to one embodiment of the invention. A dielectric material is deposited at the opening 140 on top of the doped polysilicon layer 130. Any suitable dielectric material can be used such as oxide or nitride. Then the dielectric material is etched to form two gate spacers 510 facing the ILD spacers 330 and on top of the doped polysilicon layer 130. Each of the gate spacers 510 is etched to have an arc-shaped side wall and a vertical wall. The vertical wall faces the vertical wall of the corrresponding ILD spacer 330. The arc-shape sidewall has appropriate curvature so that the resulting lines of force of the field are sufficiently long for reduced fringing capacitance. The curvature is such that the arc-shaped gate sidewall increases in width as function of decreasing height above the polysilicon layer 130.

Figure 6:
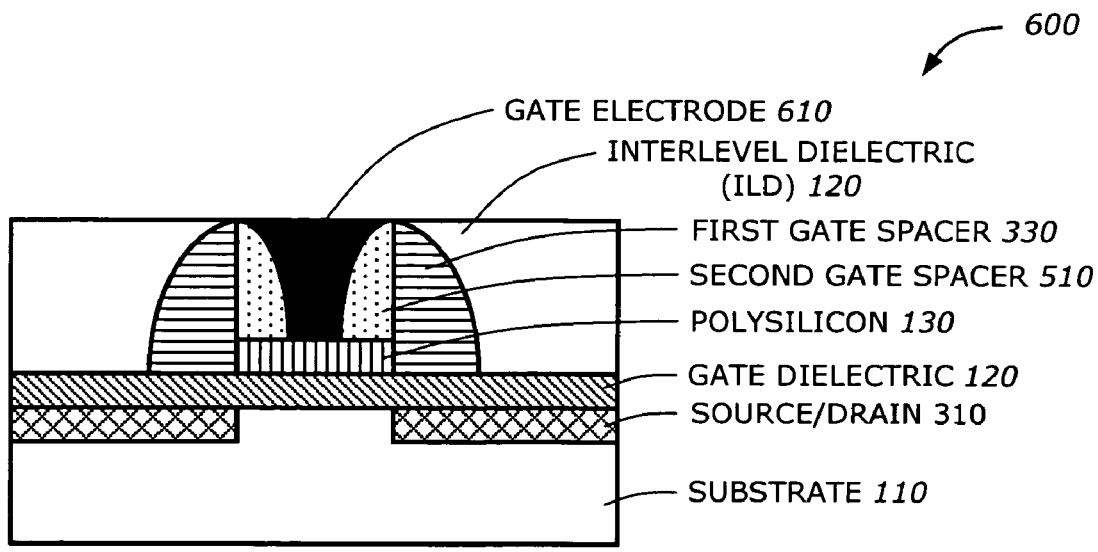
FIG. 6 is a diagram illustrating formation of a gate electrode according to one embodiment of the invention.

FIG. 6 is a diagram illustrating formation of a gate electrode 610 according to one embodiment of the invention. A gate electrode material such as doped polysilicon or metal is deposited and polished down to the ILD layer 120 to form a gate electrode 610. The gate electrode 610 have two arc-shaped electrode sidewalls fitting the arc-shaped gate sidewalls of the gate spacers 510. The arc-shaped electrode sidewall decreases in width as function of decreasing height above the polysilicon layer 130.

Figure 7:
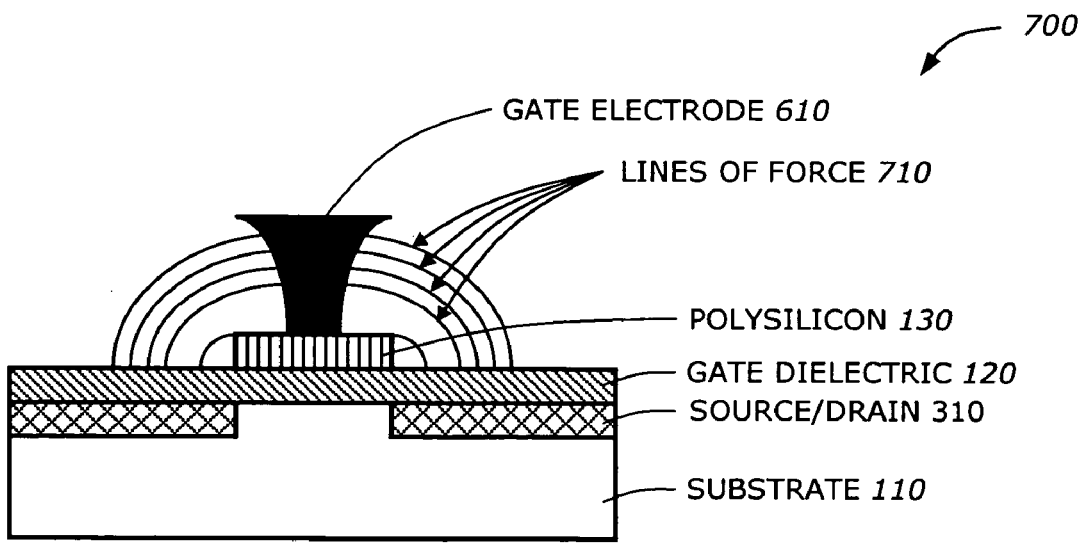
FIG. 7 is a diagram illustrating lines of force according to one embodiment of the invention.

FIG. 7 is a diagram illustrating lines of force 710 according to one embodiment of the invention. The lines of force 710 have a number of lines which are approximately equal in length. Since the lines of force 710 are fairly long as decreasing height above the polysilicon layer 130, the resulting fringing capacitance is reduced.

Figure 8:
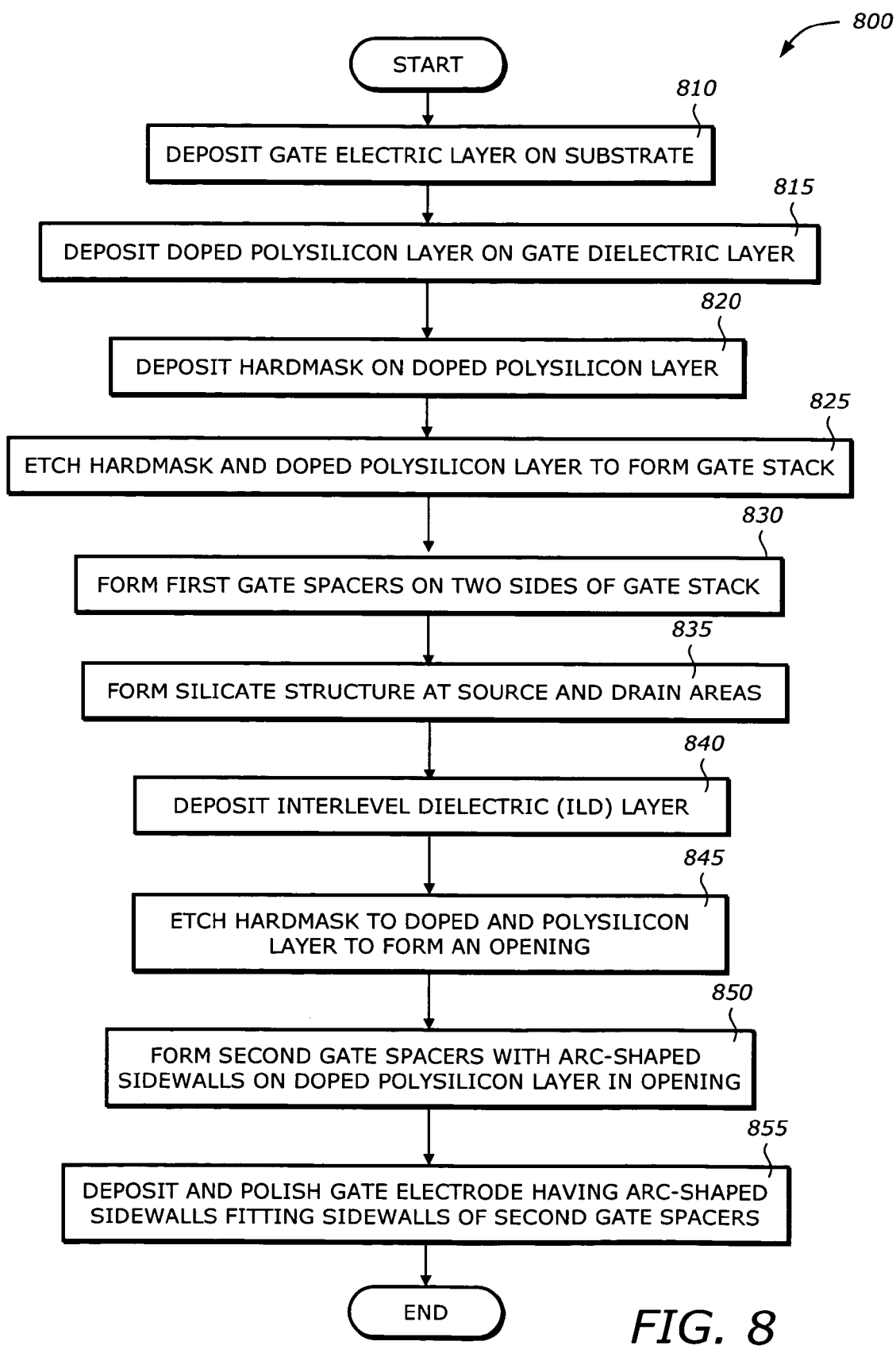
FIG. 8 is a flowchart illustrating a process to form a device with reduced fringing capacitance according to one embodiment of the invention.

FIG. 8 is a flowchart illustrating a process 800 to form a device with reduced fringing capacitance according to one embodiment of the invention.

Upon START, the process 800 deposits a gate dielectric layer on the substrate (Block 810). Then, the process 800 deposits a doped polysilicon layer on the gate dielectric layer (Block 815) using standard techniques. Next, the process 800 deposits a hardmask on the doped polysilicon layer (Block 820) to result in a structure as shown in FIG. 1.

Then, the process 800 etches the hardmask and the doped polysilicon layer to form a gate stack (Block 825) as shown in FIG. 2. Next, the process 800 forms first gate spacers on two sides of the gate stack (Block 830) and them forms a silicide structure at the source and drain areas between the substrate and the gate dielectric layer (Block 835). Then, the process 800 deposits an interlevel dielectric (ILD) layer (Block 840) as shown in FIG. 3.

Next, the process 800 etches the hardmask to the doped polysilicon layer to form an opening above the doped polysilicon layer (Block 845) as shown in FIG. 4. Then, the process 800 forms two second gate spacers on the doped polysilicon layer in the opening (Block 850). The second gate spacers have arc-shaped gate sidewalls. Next, the process 800 deposits and polishes a gate electrode in the opening (Block 855). The gate electrode have arc-shaped electrode sidewalls fitting the arc-shaped gate sidewalls as shown in FIG. 6. The process 800 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:

forming a gate stack comprising a hardmask and a doped polysilicon layer on a base structure having a substrate and a gate dielectric layer, the substrate having a gate area and source and drain areas, the gate stack being located on the gate area;

forming an interlevel dielectric (ILD) layer having first gate spacers on two sides of the gate stack;

etching the hardmask to the doped polysilicon layer to form an opening above the doped polysilicon layer;

forming two second gate spacers on the doped polysilicon layer in the opening, the second gate spacers having arc-shaped gate sidewalls; and depositing and polishing a gate electrode in the opening to the ILD layer, the gate electrode having arc-shaped electrode sidewalls fitting the arc-shaped gate sidewalls.

2. The method of claim 1 wherein forming the gate stack comprises:

depositing the gate dielectric layer on the substrate;

depositing the doped polysilicon layer on the gate dielectric layer;

depositing the hardmask on the doped polysilicon layer; and etching the hardmask and the doped polysilicon layer to form the gate stack on the gate area.

3. The method of claim 1 further comprising:

forming the first gate spacers on two sides of the gate stack; and forming a silicide structure at the source and drain areas between the substrate and the gate dielectric layer.

4. The method of claim 1 wherein forming the ILD layer comprises:

depositing the ILD layer on the first gate spacers and the gate dielectric layer.

* * * * *